REGENERATIVE AMPLIFIER

Filed Dec. 29, 1960 2 Sheets-Sheet 1

INVENTOR
GENUNG L. CLAPPER

Sughrue, Rothwell, Mion & Zinn
ATTORNEYS

REGENERATIVE AMPLIFIER

Filed Dec. 29, 1960

3,185,861
REGENERATIVE AMPLIFIER

Genung L. Clapper, Vestal, N.Y., assignor to International Business Machines Corporation, New York, N.Y., a corporation of New York Filed Dec. 29, 1960, Ser. No. 79,308
2 Claims. (Cl. 307—88.5)

This invention relates to regenerative amplifiers and more particularly to a regenerative amplifier having a very small delay between input and output.

In many applications it is desirable to reshape a pulse which has deteriorated in wave-shape. Numerous prior art wave-shaping amplifiers have been provided for this purpose. However, most of these prior art circuits have serious disadvantages in that there is a time delay between the occurrence of the deteriorated pulse at the input of the amplifier and the occurrence of the reshaped pulse at the output.

This time delay causes timing difficulties in many applications, particularly where a plurality of wave-shaping amplifiers must be employed. An example of an application in which this is a particular consideration is in high speed adder circuitry. In a parallel adder, that is, one in which all the bits of a number may be presented simultaneously to the adder, particularly high speed operation may be obtained by using a so-called two-step adder in which two half adders are used for each bit. This adder is so designed that the carry is propagated in ripple fashion through diode logic. This provides an extremely fast carry in a parallel adder. However, a regenerative amplifier must be provided to reshape the pulse at the output of each half adder section without creating undue delay.

Accordingly, it is an object of the present invention to provide an improved regenerative amplifier having a very small delay between the input and output.

It is a further object of the present invention to provide an improved regenerative amplifier particularly suitable for use in high speed parallel adders.

It is a further object of the present invention to provide an improved transistorized regenerative amplifier which can produce a full size pulse from a deteriorated pulse with a delay of approximately four milli-microseconds.

In accordance with one embodiment of the invention, a diode OR circuit is provided at the input of the regenerative amplifier. Pulses at either input of the diode OR circuit are applied to the base of an emitter follower output driver. As the output rises, displacement current flows in a capacitor coupling the emitter of the output driver with the emitter of a feedback transistor. This current is fed back to the input circuit to provide regeneration. The result is that the circuit has an exceedingly fast response with extremely small delay. Since the regenerated pulse from the output is the result of the stored charge on the coupling capacitor, the pulse width is a function of this charge and may be varied as required. As an example, a 150 micromicrofarad coupling capacitor produces a pulse width of 120 milli-microseconds which is the desired pulse width for 5 megacycle parallel adder operation. A narrow input pulse will be reshaped to this width since the input pulse only starts the regenerative action and the feedback completes the formation of the output pulse. Thus, high speed carry in a parallel adder is assured.

The foregoing and other objects, features and advantages of the invention will be apparent from the following more particular description of a preferred embodiment of the invention, as illustrated in the accompanying drawings.

Figure 1:
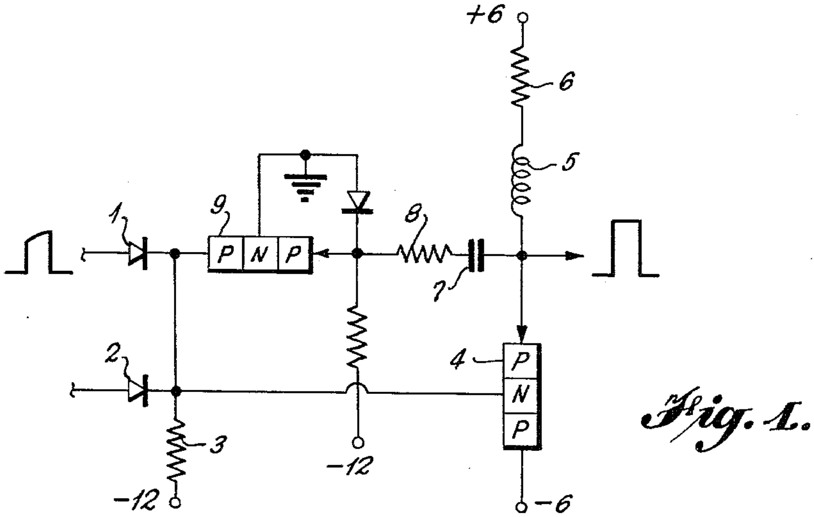
FIG. 1 is a circuit diagram of the regenerative amplifier of the present invention.

Referring to FIG. 1, there are shown diodes 1 and 2 which are biased by a resistor 3 to form an OR gate for positive input pulses. A pulse at either input is applied to the base of an emitter follower output driver 4. Emitter follower 4 is turned off thus producing an output pulse across inductor 5 and resistor 6. As the output rises, displacement current flows in the coupling capacitor 7. This current is fed back through a resistor 8 and a feedback transistor 9 to the base of the emitter follower output driver 4. The feedback provides regeneration thus giving the circuit an exceedingly fast response time with extremely small delay.

As previously mentioned, the size of the coupling capacitor 7 determines the width of the output pulse and this may be varied as required. In one actual embodiment a 150 micromicrofarad capacitor produced a pulse width of 120 milli-microseconds.

Figure 3A:
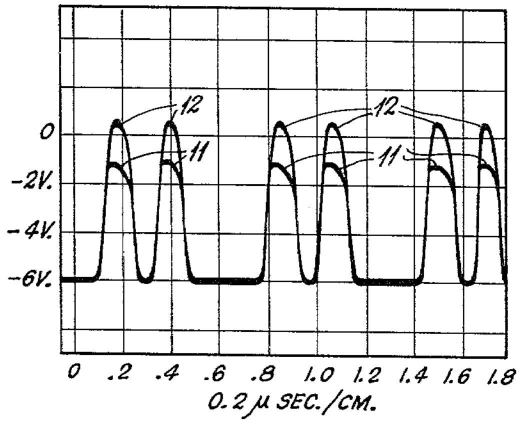
FIGS. 3A and 3B show wave forms depicting the operation of the circuitry of the present invention.
Figure 3B:
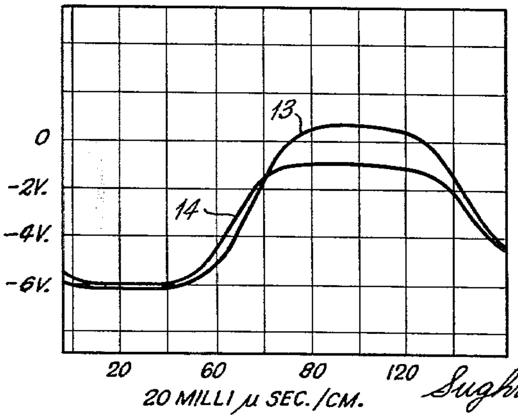

Referring to FIGS. 3A and 3B, there are shown actual wave forms depicting the circuit operation with the output pulse superimposed upon the input pulse to show the exceedingly fast response of the subject circuit. In FIG. 3A the vertical scale is two volts per centimeter and the horizontal scale is 0.2 microsecond per centimeter. The input pulse is indicated at 11 while the superimposed output pulse is indicated at 12. As can be seen, the beefed up output pulse very nearly coincides with the deteriorated input pulse. The actual lag of the output pulse behind the input pulse 11 can better be seen in FIG. 3B which has the same vertical scale of two volts per centimeter but has a horizontal scale of 20-milli-microseconds per centimeter. The output pulse 13 lags the input pulse 14 by approximately 4 milli-microseconds. This is an extremely fast response time and is comparable with the very fast operation of the two-step adder.

Figure 2:
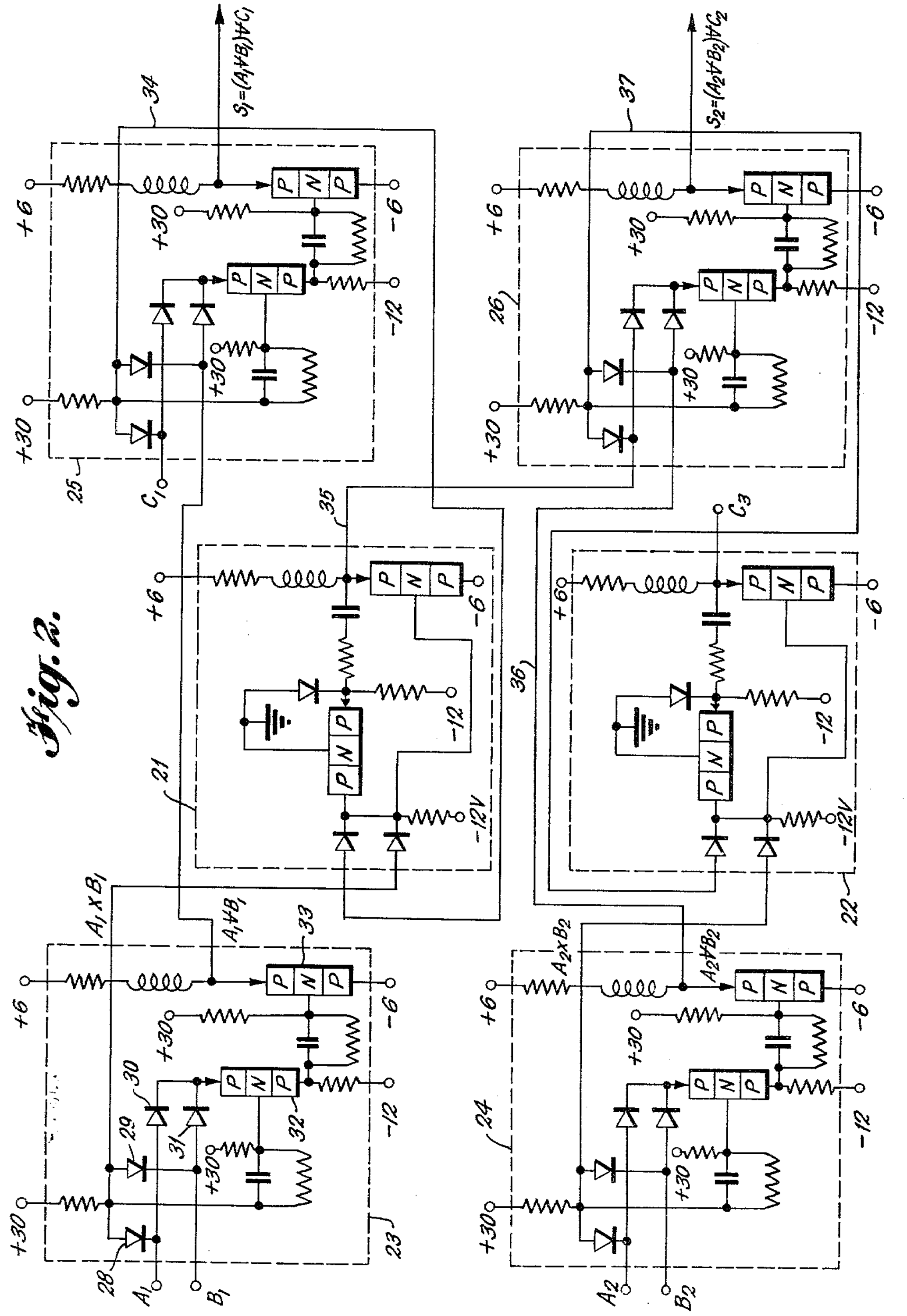
FIG. 2 is a circuit diagram of a parallel adder utilizing the regenerative amplifier of the present invention.

Referring to FIG. 2, there is shown a two bit parallel adder utilizing regenerative amplifiers 21 and 22 of the present invention to interconnect the half adder stages 23, 24, 25, and 26. The adder circuitry shown in FIG. 2 performs a parallel addition of the $A_1$ and $A_2$ bits of a first number and the $B_1$ and $B_2$ bits of a second number.

The half adder 23 produces an output function $A_1XB$ by means of an AND gate including diodes 28 and 29. Half adder 23 also produces the exclusive OR function $A_1VB_1$ by means of diodes 30 and 31 and transistors 32 and 33 operating in conjunction with the above mentioned AND gate.

The exclusive OR output of half adder 23 is connected to one input of half adder 25. The other input to half adder 25 is the input carry $C_1$. The exclusive OR output of half adder 25 is the first partial sum $S_1$. The AND function output, over line 34, is a first partial carry and is connected to the diode OR gate in regenerative amplifier 21. The other input to the OR gate in regenerative amplifier 21 is the AND function output from half adder 23. The output of regenerative amplifiers 21, line 35, forms one input to half adder 26.

Similarly, half adder 24 forms the exclusive OR function of the $A_2$ and $B_2$ bits and this function is connected, over line 36, to half adder 26. The exclusive OR output of half adder 26 is the second partial sum $S_2$. The AND function output of half adder 26 is connected, over line 37, to the OR circuit of regenerative amplifier 22. The other input to the OR circuit in regenerative amplifier 22 is the AND function output of half adder 24. The output of regenerative amplifier 22 is the carry $C_3$.

Summarizing the operation of the two-step parallel adder shown in FIG. 2, the circuitry adds two bits $A_1$ and $A_2$ of a first number, two bits of $A_2$ and $B_2$ of a second number and an input carry $C_1$. The resulting output includes a first bit sum $S_1$, a second bit sum $S_2$ and a carry $C_3$. By using two half adders for each bit inner-connected to form a two-step adder as shown in the FIG. 2, extremely fast operation of the adder is obtained. In utilizing this technique it is quite necessary to provide an extremely fast response regenerative amplifier as has been shown and described.

While the invention has been particularly shown and described with reference to a preferred embodiment thereof, it will be understood by those skilled in the art that the foregoing and other changes in form and details may be made therein without departing from the spirit and scope of the invention.

What I claim as new and desire to secure by Letters Patent of the United States is:

1. A regenerative amplifier for producing a reshaped pulse output in response to the occurrence of a pulse input comprising diode OR circuitry, said pulse inputs being connected to the inputs to said OR circuitry, an emitter follower output transistor, the collector of said emitter follower being connected to a source of potential of a first polarity, an inductance, a load resistance and a source of potential of a second polarity, said three last named elements being connected in series, the emitter of said emitter follower being connected to said inductance, the output of said OR circuitry being connected to the base of said emitter follower, a coupling capacitor, the emitter of said emitter follower being connected to one side of said coupling capacitor, a feedback transistor, the base of said feedback transistor being grounded, the other side of said coupling capacitor being connected to the emitter of said feedback transistor, the collector of said feedback transistor being connected to the base of said emitter follower transistor.

2. The regenerative amplifier recited in claim 1 wherein said emitter follower and said feedback transistors are PNP transistors, said first source of potential is of negative polarity and said second source of potential is of positive polarity.

References Cited by the Examiner

UNITED STATES PATENTS

| | | | |
|---|---|---|---|
| 2,244,261 | 6/41 | Rath | 179—171 |
| 2,404,047 | 7/46 | Hovy et al. | 235—164 |
| 2,525,077 | 10/50 | Morton | 235—175 |
| 2,621,264 | 12/52 | Hultberg | 179—171 |
| 2,694,521 | 11/54 | Newman et al. | 235—175 X |
| 2,808,204 | 10/57 | Geyer et al. | 235—175 |
| 2,881,978 | 4/59 | Kilburn et al. | 235—164 |
| 2,903,604 | 9/59 | Henle | 328—186 |
| 2,912,654 | 11/59 | Hansen | 330—26 |
| 2,971,099 | 2/61 | Rosenberg et al. | 307—88.5 |
| 2,975,303 | 3/61 | Chopper | 307—88.5 |

OTHER REFERENCES

Richards: Digital Computer Components and Circuits, D. Van Nostrand Co., Inc., 1957, page 54 relied on.

JOHN W. HUCKERT, *Primary Examiner.*

CORNELIUS D. ANGEL, WALTER W. BURNS, Jr., MALCOLM A. MORRISON, *Examiners.*